United States Patent [19]

Takeuchi

[11] Patent Number: 4,763,025
[45] Date of Patent: Aug. 9, 1988

[54] FREQUENCY DISCRIMINATION CIRCUIT

[75] Inventor: Kunihiro Takeuchi, Higashimatsuyama, Japan

[73] Assignee: Diesel Kiki Co., Ltd., Tokyo, Japan

[21] Appl. No.: 837,754

[22] Filed: Mar. 10, 1986

[30] Foreign Application Priority Data

Mar. 12, 1985 [JP] Japan .............................. 60-047414

[51] Int. Cl.$^4$ .......................... H03K 9/06; H03D 3/02
[52] U.S. Cl. .................................. 307/526; 307/234; 328/134; 328/141
[58] Field of Search ............... 307/234, 526, 271, 273; 328/138, 140, 141, 111, 134, 109, 110

[56] References Cited
U.S. PATENT DOCUMENTS 3,593,161  7/1971  Ritz ................................. 307/234
4,318,047  3/1982  Dawson ............................ 307/234

OTHER PUBLICATIONS

Beattie, "Simple Pulse Width Checking Circuit", Electronic Engineering, vol. 52, No. 643, Oct. 1980, p. 31.

Primary Examiner—Stanley D. Miller
Assistant Examiner—Timothy P. Callahan
Attorney, Agent, or Firm—James Creighton Wray

[57] ABSTRACT

In a frequency discrimination circuit, a first retriggerable monostable multivibrator is triggered in response to the period of a signal to be measured to produce a first pulse output having a pulse width corresponding to the period of a reference frequency, and a second retriggerable monostable multivibrator produces a second pulse output having a pulse width wider than that of the first pulse output in response to a repetitive pulse signal which has a constant period smaller than the pulse width of the first pulse output and is generated only when the first pulse output is not produced, whereby it is possible to discriminate whether or not the frequency of the signal to be measured is higher than the reference frequency with high response characteristics.

5 Claims, 3 Drawing Sheets

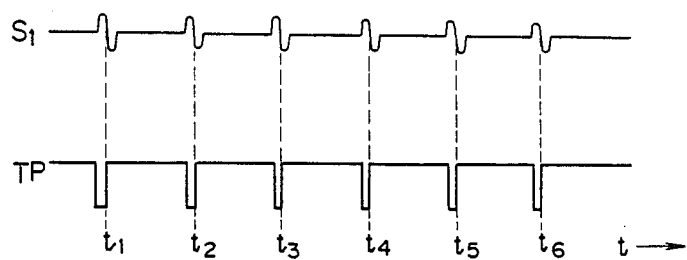
FIG.2A
FIG.2B
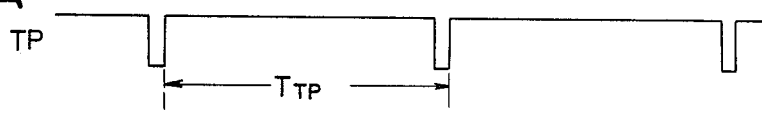
FIG.3A
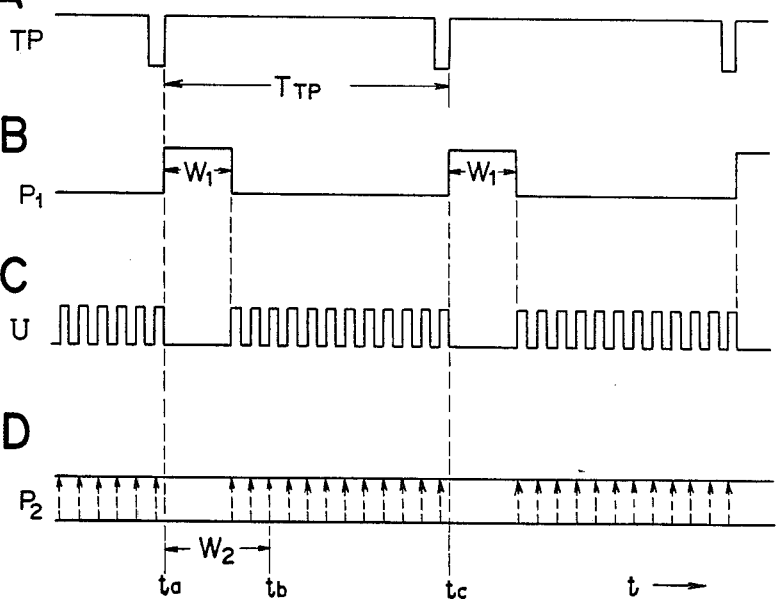
FIG.3B
FIG.3C
FIG.3D

FIG.4A TP 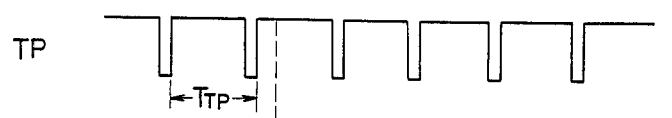
FIG.4B P₁ 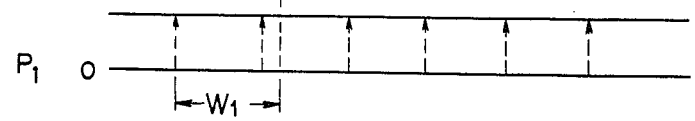
FIG.4C P₂ 
FIG.5A TP 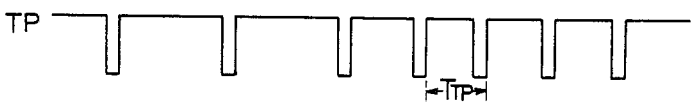
FIG.5B P₁ 
FIG.5C U 
FIG.5D P₂ 

FREQUENCY DISCRIMINATION CIRCUIT

BACKGROUND OF THE INVENTION

The present invention relates to a discrimination circuit for discriminating whether or not the frequency of a signal is higher than a predetermined reference frequency.

For discriminating whether or not the frequency of a signal is higher than a predetermined frequency, there is a well-known circuit in which a direct current signal with a level corresponding to the frequency of the signal is produced and the level of the direct current signal is compared with a reference level corresponding to the reference frequency. However, this circuit requires a smoothing circuit for obtaining a direct current signal with a level corresponding to the frequency of the signal to be measured, and the response characteristics tend to be poor owing to the time constant of the smoothing circuit.

To remove this disadvantage of the prior art circuit, U.S. Pat. No. 4,463,269 discloses a frequency discrimination circuit employing two retriggerable monostable multivibrators. This circuit has a first retriggerable monostable multivibrator which is capable of producing a first pulse signal with a pulse width equal to the half of period of a reference frequency and a second retriggerable monostable multivibrator which is capable of producing a second pulse signal with a pulse width longer than the half of period of the signal to be measured, and is constructed in such a way that the first retriggerable monostable multivibrator is triggered by the signal to be measured and the second retriggerable monostable multivibrator is triggered by the output signal of the first retriggerable monostable multivibrator.

Therefore, in this prior art circuit, when the frequency of the signal to be measured is not higher than the reference frequency, the period of the output pulse signal from the first retriggerable monostable multivibrator is longer than that of the reference frequency, so that the second retriggerable monostable multivibrator continues to be triggered by the output pulse signal of the first retriggerable monostable multivibrator before the output level of the second retriggerable monostable multivibrator becomes low. As a result, the output level of the second retriggerable monostable multivibrator is continuously maintained at high level.

On the other hand, when the frequency of the signal to be measured is higher than the reference frequency, the output level of the first retriggerable monostable multivibrator is maintained at high level, so that the second retriggerable monostable multivibrator is not triggered. Thus, the output level of the second retriggerable monostable multivibrator is maintained at low level.

The prior art circuit mentioned above is able to discriminate whether or not the frequency is higher than a predetermined reference frequency with a response delay corresponding to the pulse width of the output pulse of the second retriggerable monostable multivibrator when the frequency of the signal to be measured is in the vicinity of the reference frequency. However, since it is a condition for the operation of the circuit that the width of the output pulse of the second retriggerable monostable multivibrator be longer than the period of the signal to be measured, the frequency discriminating operation becomes impossible in a case where the period of the signal to be measured becomes longer than the width of the output pulse of the second retriggerable monostable multivibrator due to a decrease in the frequency of the signal to be measured. If the pulse width is elongated, the response delay time will increase.

As a result, in the case where the frequency to be discriminated varies widely, as, for example, a signal indicative of the rotational speed of an internal combustion engine, the discrimination circuit will sometimes become inoperative for the reason mentioned above.

SUMMARY OF THE INVENTION

It is an object of the present invention to provide an improved discrimination circuit for discriminating whether or not the frequency of a signal is higher than a predetermined frequency.

It is another object of the present invention to provide a discrimination circuit which is capable of discriminating whether or not the frequency of a signal is higher than a predetermined frequency with excellent response characteristics.

It is a further object of the present invention to provide a discrimination circuit for discriminating between a high frequency and a low frequency with excellent response characteristics even in the case where the frequency to be discriminated varies widely.

According to the present invention, in a discrimination circuit for discriminating whether or not the frequency of a signal to be measured is higher than a reference frequency, the circuit has a generating means responsive to the signal to be measured for generating a trigger signal with a period corresponding to that of the signal to be measured, a first retriggerable monostable multivibrator which is triggered by the trigger signal and is capable of producing a first pulse output with a pulse width corresponding to the period of the reference frequency, a first circuit means for generating a repetitive pulse signal with a constant period which is smaller than the pulse width of the first pulse output, a second circuit means responsive to a first output signal from the first retriggerable monostable multivibrator and the repetitive pulse signal for controlling the repetitive pulse signal so as to be derived only when the first pulse output is not produced, and a second retriggerable monostable multivibrator which is triggered in response to an output from the second circuit means and is capable of producing a second pulse output with a pulse width wider than that of the first pulse output.

When the period of the signal to be measured is longer than the reference period, the time from the time the trigger signal is produced to the time the following trigger signal is produced becomes longer than the pulse width of the first pulse output. Therefore, the level of the first output signal is repetitively changed between high and low. In this case, the repetitive pulse signal is derived as the output signal from the second circuit means during the low level state of the first output signal. As a result, the second retriggerable monostable multivibrator continues to be triggered by the repetitive pulse signal derived from the second circuit means at intervals of time shorter than the pulse width of the second pulse output, so that the level of a second output signal produced from the second retriggerable monostable multivibrator is maintained high. In this case, even if the frequency of the signal to be measured becomes extremely low and the period thereof becomes larger than the pulse width of the second pulse output, the second retriggerable monostable multivibrator continues to be triggered by the repetitive pulse signal. As a result, the level of the second output signal is maintained high.

On the other hand, when the period of the signal to be measured is smaller than the reference period, the first retriggerable monostable multivibrator continues to be triggered by the trigger signal at intervals of time shorter than the pulse width of the first pulse output. Therefore, the first pulse output is continuously produced in such a way that the first pulse output is produced before the level of the preceding first pulse output becomes low, so that the output level of the first retriggerable monostable multivibrator is maintained high. As a result, the second retriggerable monostable multivibrator is not triggered at all, so that the output level thereof is maintained low.

As described above, the output of the second retriggerable monostable multivibrator is maintained at high or low level depending upon whether or not the period of the signal to be measured is shorter than the reference period, whereby it is possible to discriminate between high and low frequency.

In the circuit according to the present invention, when the level of the first output signal becomes low, the second retriggerable monostable multivibrator is continuously triggered by the repetitive pulse signal derived from the second circuit means to maintain the level of the second output signal high. Therefore, it is not required to increase the time constant of the second retriggerable monostable multivibrator. Thus, even when the frequency of the signal to be measured varies widely, it is sufficient for the pulse width of the second pulse output to be set a little longer than that of the first pulse output. Consequently, this circuit is capable of discriminating between high and low frequency with high response characteristics even for a signal whose frequency changes widely.

The invention will be better understood and other objects and advantages thereof will be more apparent from the following detailed description of preferred embodiments with reference to the accompanying drawings.

BRIEF DESCRIPTION OF THE DRAWINGS

FIGS. 2A and 2B are waveforms appearing in the circuit of FIG. 1; and

FIGS. 3A to 3D, 4A to 4C and 5A to 5D are time charts for explaining the operation of the circuit shown in FIG. 1.

DESCRIPTION OF PREFERRED EMBODIMENT

Figure 1:
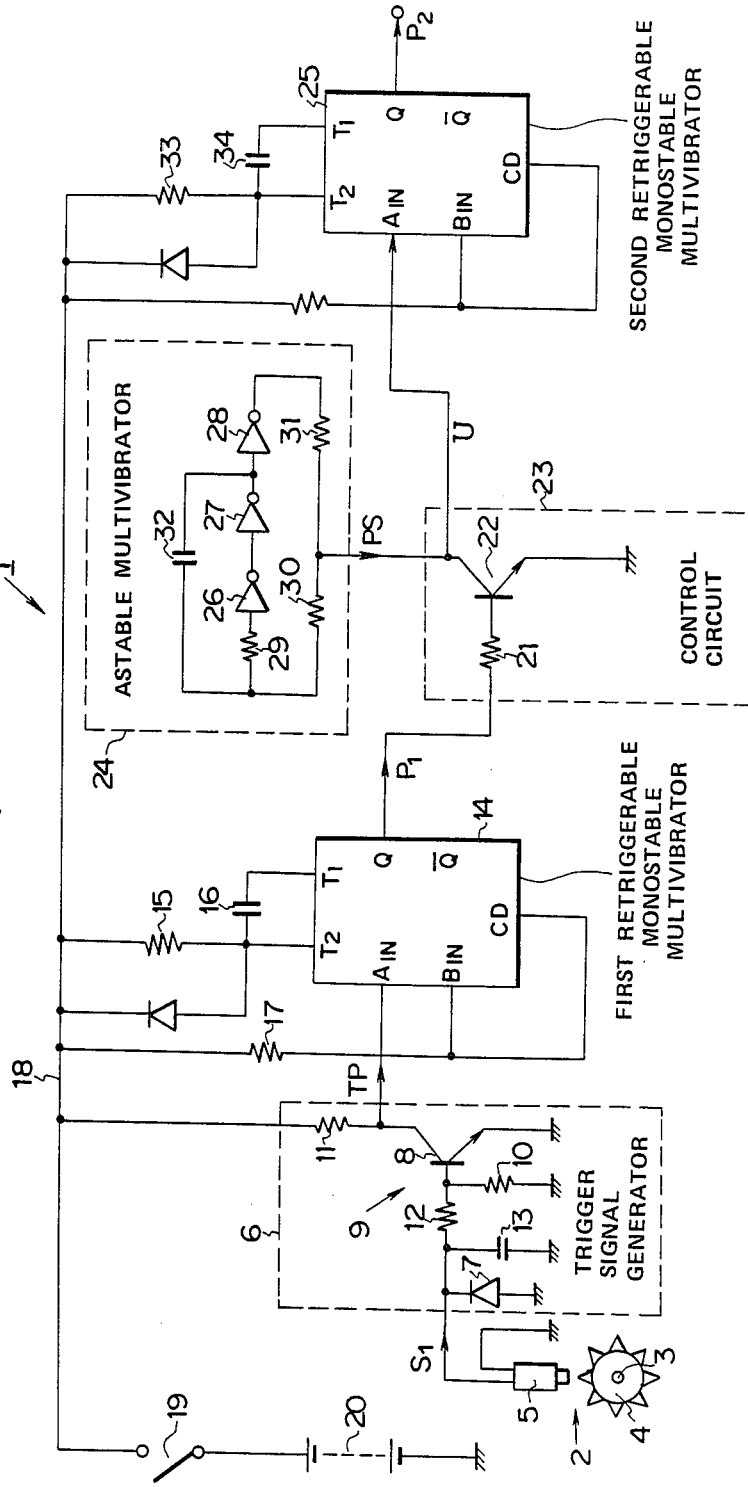
FIG. 1 is a circuit diagram of an embodiment of a discrimination circuit for discriminating whether or not a frequency is higher than a predetermined frequency according to the present invention.

FIG. 1 is a circuit diagram of an embodiment of a discrimination circuit for discriminating frequency according to the present invention. A discrimination circuit 1 is responsive to a sensor output signal $S_1$ generated by a speed sensor 2 for detecting the rotational speed of an internal combustion engine (not shown) and discriminates whether or not the frequency of the sensor output signal $S_1$ is higher than a predetermined reference frequency.

The speed sensor 2 is a well known sensor which is composed of a pulser 4 secured on a crankshaft 3 of the engine and an electromagnetic pick-up coil 5 located so as to face the pulser 4, and the sensor output signal $S_1$ of a waveform as shown in FIG. 2A is produced by the electromagnetic pick-up coil 5 in the form of an a.c. signal. To obtain a pulse train signal consisting of pulses indicating times $t_1, t_2, \ldots$, respectively, each of which shows a zero-cross point formed by a pair of positive and negative peaks, the sensor output signal $S_1$ is applied to a trigger signal generator 6.

The trigger signal generator 6 includes a diode 7 connected in parallel with one terminal of the electromagnetic pick-up coil 5 and a transistor 8 the emitter of which is grounded. The base of the transistor 8 is connected through a resistor 12 to the one terminal of the electromagnetic pick-up coil 5 and grounded through a resistor 10. For removal of noise components, a capacitor 13 is connected in parallel with the diode 7 and the signal rectified by the diode 7 is applied through the resistor 12 to the transistor 8 after the noise component is removed by the capacitor 13. The collector of the transistor 8 is connected through a resistor 11 to a positive line 18 which is connected through a power switch 19 to the positive terminal of a battery 20 the negative terminal of which is grounded. A saturation amplifier 9 is formed by use of the transistor 8 in the trigger signal generator 6. The diode 7 allows only positive peak components of the sensor output signal $S_1$ to pass through and the positive peak components are applied to the saturation amplifier 9 to produce a trigger pulse signal TP (FIG. 2B). As will be understood, the leading edge of each pulse of the trigger pulse signal TP represents a zero cross timing of the sensor output signal $S_1$ in this embodiment. The trigger pulse signal TP is derived from the collector circuit of the transistor 8 and applied to a first retriggerable monostable multivibrator 14 which is realized by the use of a TC 4538 BP.

The first retriggerable monostable multivibrator 14 has a trigger input terminal $A_{IN}$ to which the trigger pulse signal TP is applied, and a pulse output appears on an output terminal Q in response to the application of the trigger pulse signal TP. The first retriggerable monostable multivibrator 14 further comprises terminals $T_1$ and $T_2$, and the terminal $T_2$ is connected through a resistor 15 to the positive line 18. The terminal $T_2$ is connected through a capacitor 16 to the terminal $T_1$ and the pulse width of the pulses of a first output pulse signal $P_1$ appearing at the terminal Q can be adjusted by setting the values of the resistor 15 and the capacitor 16. The first retriggerable monostable vibrator 14 also has terminals $B_{IN}$ and CD which are connected together and connected through a resistor 17 to the positive line 18. The retriggerable monostable multivibrator 14 is adapted to be triggered in response to a level change from low to high at the terminal $A_{IN}$ and the level of the output pulse $P_1$ at the terminal Q changes from low to high for a period determined by the values of the resistor 15 and the capacitor 16 when the retriggerable monostable multivibrator 14 is triggered. As a result, first pulses with a pulse width $W_1$ are output from the terminal Q in response to the application of the trigger pulse signal TP, and the signal appearing at the terminal Q is output as the first output signal $P_1$.

The first output signal $P_1$ is applied to a control circuit 23 composed of a resistor 21 and a transistor 22 the emitter of which is grounded. The first output signal $P_1$ is applied through the resistor 21 to the base of the transistor 22 and an astable multivibrator 24 is connected to the collector circuit of the transistor 22.

The astable multivibrator 24 is a well known circuit composed of inverters 26 to 28, resistors 29 to 31 and a capacitor 32, and produces a repetitive pulse signal PS having a constant repetitive period which is set to be sufficiently smaller than the pulse width $W_1$. The repetitive pulse signal PS is applied to the collector of the transistor 22 and the first output signal $P_1$ is applied to the base thereof, so that the repetitive pulse signal PS can be derived from the control circuit 23 as an output signal U when the transistor 22 is OFF due to the low level of the base.

The collector of the transistor 22 is connected to a terminal $A_{IN}$ of a second retriggerable monostable multivibrator 25 which has the same construction as that of the first retriggerable monostable multivibrator 14. However, in this case, the values of a resistor 33 and a capacitor 34 are adjusted in such a way that a second output signal $P_2$ with pulses of a width $W_2$ which is little wider than the pulse width $W_1$ obtained from the terminal Q when the output signal U from the control circuit 23 is applied as a trigger signal to the terminal $A_{IN}$ of the second retriggerable monostable multivibrator 25.

The operation of the discrimination circuit 1 shown in FIG. 1 will be now described in conjunction with FIGS. 3 to 5.

First, the operation where the frequency of the sensor output signal $S_1$ to be discriminated is lower than the reference frequency will be described with reference to FIG. 3. In this case, the repetitive period $T_{TP}$ between the trigger pulses of the trigger pulse signal TP is longer than the pulse width $W_1$ of the first pulse output $P_1$ of the first retriggerable monostable multivibrator 14, as shown in FIGS. 3A and 3B. Therefore, the high level state of the pulse output of the first retriggerable monostable multivibrator 14 obtained in response to the trigger pulses terminates before the time of the level rise of the following trigger pulse. As a result, the first output signal $P_1$ changes in level as shown in FIG. 3B. The control circuit 23 is responsive to the first output signal $P_1$ and supplies the repetitive pulse signal PS as the output signal U only when the level of the first output signal $P_1$ is low. Thus, the waveforms of the output signal U will be as shown in FIG. 3C.

The second retriggerable monostable multivibrator 25 is responsive to the output signal U and is triggered at each leading edge as indicated by the output signal U. The second retriggerable monostable multivibrator 25 operates so as to maintain the high level state at its output terminal Q during the time $W_2$ following a trigger operation. In this case, since the pulse width $W_2$ is set so as to be a little longer than the pulse width $W_1$, the level of the second output signal $P_2$ produced by the triggering operation by the level change of the first output signal $P_1$ at $t=t_a$ becomes low at $t=t_b$ if the repetitive pulse signal PS is not applied as the output signal U to the second retriggerable monostable multivibrator 25, and the low level state of the second output signal $P_2$ is maintained till time $t_c$ which is the time of the following level rise of the first trigger pulse signal $TP_1$. However, the repetitive pulse signal PS is produced as the output signal U from the control circuit 23 when the level of the first output signal $P_1$ is low. As a result, the second retriggerable monostable multivibrator 25 is triggered by the output signal U before the level of the second output signal $P_2$ falls from high to low at $t_b$, so that the level of the second output signal $P_2$ is maintained high. In this case, it is required for the pulse width $W_2$ to be longer than the pulse width $W_1$ by the pulse width of the repetitive pulse signal PS.

Now, the operation where the frequency of the sensor output signal $S_1$ to be discriminated is higher than the reference frequency will be described with reference to FIG. 4. In this case, the repetitive period $T_{TP}$ between the trigger pulses TP is shorter than the pulse width $W_1$, as shown in FIGS. 4A and 4B, so that the first retriggerable monostable multivibrator 14 is triggered again before the level of the first output signal $P_1$ returns to low level once the first retriggerable monostable multivibrator 14 is triggered. As a result, the level of the first output signal $P_1$ is maintained high as shown in FIG. 4B. Consequently, the repetitive pulse signal PS is not derived from the control circuit 23, so that the second retriggerable monostable multivibrator 25 is not triggered, whereby the level of the second output signal $P_2$ is maintained low (FIG. 4C).

Next, the operation where the frequency of the sensor output signal $S_1$ changes from a lower level than the reference frequency to higher level than the reference frequency will be explained with reference to FIG. 5.

Assume that the repetitive period $T_{TP}$ of the first trigger pulse signal $TP_1$ shown in FIG. 5A gradually decreases with the passage of time in accordance with an increase in the engine speed and the frequency of the sensor output signal $S_1$ becomes equal to the reference frequency approximately at $t=t_d$. In such case, the circuit operation before $t_d$ is that described in conjunction with FIG. 3. When the level of the first output signal $P_1$ changes from low to high at $t=t_d$ (FIG. 5B), the second retriggerable monostable multivibrator 25 is triggered. Since the frequency of the sensor output signal $S_1$ becomes higher than the reference frequency, the first retriggerable monostable multivibrator 14 is triggered in response to the rising edge of the first trigger pulse $TP_1$ produced at $t=t_e$ before the level of the first output signal $P_1$ falls back to low. As a result, the level of the first output signal $P_1$ does not become low, but is maintained high. This operation is the same as that described above in conjunction with FIG. 4, and the second retriggerable monostable multivibrator 25 is not triggered. Accordingly, the level of the second output signal $P_2$ becomes low at $t_f$, which is time $W_2$ after the time $t_d$, and the low level condition is maintained thereafter.

That is, when the frequency of the sensor output signal $S_1$ becomes higher than the reference frequency at $t_d$, the level of the second output signal $P_2$ becomes low after a lapse of time $W_2$, whereby it can be discriminated that the frequency of the sensor output signal $S_1$ has become higher than the reference frequency.

As will be understood from the foregoing description, the time $W_2$ is set so as to be a little longer than the time $W_1$. Strictly speaking, it is sufficient for the time $W_2$ to be longer than the sum of $W_1$ and the time of one period of the repetitive pulse signal PS.

With the aforesaid arrangement of the discrimination circuit 1, the operation for discriminating between high and low frequency is assured even when the frequency of the sensor output signal $S_1$ to be discriminated varies widely. Furthermore, the response time necessary for the discriminating operation is $W_2$, so that the response time can be remarkably reduced as compared with the prior art circuit. Accordingly, even in a case where the frequency of the signal to be discriminated changes widely as, for example, in the case of signal indicative of the speed of an internal combustion engine, discrimination of whether or not the frequency is higher than the reference frequency can be reliably carried out with high response characteristics.

In addition, the discrimination circuit according to the present invention is not limited to the use shown in this embodiment, but is applicable to any use where there is a need to discriminate whether or not a frequency is higher than a predetermined frequency.

I claim:

1. A frequency discrimination circuit for discriminating whether or not a frequency of a signal being measured is higher than reference frequency, said circuit comprising,
    a generating means responsive to the signal being measured for generating a trigger pulse signal with a period which coincides with that of the signal being measured;
    a first retriggerable monostable multivibrator whose output level changes to a predetermined level condition for a period corresponding to a period of the reference frequency in response to the occurrence of the trigger pulse signal;
    a frist circuit means for generating a repetitive pulse signal with a constant period independently of the signal being measured, said constant period being smaller than the pulse width of the first pulse output;
    a second circuit means responsive to an output level of said first retriggerable monostable multivibrator and the repetitive pulse signal for permitting the repetitive pulse signal to pass therethrough only when the output level of said first retriggerable monostable multivibrator is in the predetermined level condition; and
    a second retriggerable monostable multivibrator which produces a pulse output in response to the repetitive pulse signal derived from the second circuit means, a pulse width of the pulse output being wider than that of the period of the reference frequency,
    whereby it can be discriminated on the basis of the level condition of the output of said second retriggerable monostable multivibrator whether or not the frequency of the signal being measured is higher than the reference frequency.

2. A frequency discrimination circuit as claimed in claim 1 wherein the pulse width of the pulse output is set so as to be larger than the sum of the repetitive period of the repetitive pulse signal and the period of the reference frequency.

3. A frequency discrimination circuit as claimed in claim 2 wherein the predetermined level of the output of said first retriggerable monostable multivibrator is high level.

4. A frequency discrimination circuit as claimed in claim 3 wherein said second circuit means derives the repetitive pulse signal as an output signal only when the output level of said first retriggerable monostable multivibrator is a low level.

5. A frequency discrimination circuit as claimed in claim 4 wherein the level of the pulse output of said second retriggerable monostable multivibrator changes from low to high in response to the occurrence of the output from said second circuit means.

* * * * *